(12) United States Patent
Klowak et al.

(10) Patent No.: US 9,659,854 B2
(45) Date of Patent: May 23, 2017

(54) EMBEDDED PACKAGING FOR DEVICES AND SYSTEMS COMPRISING LATERAL GAN POWER TRANSISTORS

(71) Applicant: GaN Systems Inc., Ottawa (CA)

(72) Inventors: Greg P. Klowak, Ottawa (CA); Ahmad Mizan, Kanata (CA); John Roberts, Kanata (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 15/027,012

(22) PCT Filed: Apr. 15, 2015

(86) PCT No.: PCT/CA2015/000244
§ 371 (c)(1),
(2) Date: Apr. 4, 2016

(87) PCT Pub. No.: WO2015/157845
PCT Pub. Date: Oct. 22, 2015

(65) Prior Publication Data
US 2016/0240471 A1    Aug. 18, 2016

Related U.S. Application Data

(60) Provisional application No. 61/980,101, filed on Apr. 16, 2014.

(51) Int. Cl.
*H01L 29/66* (2006.01)
*H01L 29/15* (2006.01)
(Continued)

(52) U.S. Cl.
CPC .... *H01L 23/49844* (2013.01); *H01L 23/4824* (2013.01); *H01L 23/5226* (2013.01);
(Continued)

(58) Field of Classification Search
CPC ......... H01L 23/49; H01L 23/48; H01L 23/53; H01L 23/52; H01L 29/20; H01L 29/78;
(Continued)

(56) References Cited

U.S. PATENT DOCUMENTS 6,946,740 B2    9/2005    Schaffer
8,766,711 B2    7/2014    Takemae
(Continued)

FOREIGN PATENT DOCUMENTS

EP    2426744 A2    3/2012
WO    2015061881 A1    5/2015
WO    2012103633 A1    9/2015

OTHER PUBLICATIONS

GaN Systems Inc.; Application Note entitled "Thermal Analysis and PCB Design Guidelines for GaN Enhancement Mode Power Switching Transistors"; GN005 Rev-Nov. 4, 2014 (Nov. 2014); pp. 1-14.

(Continued)

*Primary Examiner* — Yuanda Zhang
*Assistant Examiner* — Sheikh Maruf
(74) *Attorney, Agent, or Firm* — Miltons IP/p.i.

(57) ABSTRACT

Embedded packaging for devices and systems comprising lateral GaN power transistors is disclosed. The packaging assembly is suitable for large area, high power GaN transistors and comprises an assembly of a GaN power transistor and package components comprising a three level interconnect structure. In preferred embodiments, the three level interconnect structure comprises an on-chip metal layer, a copper redistribution layer and package metal layers, in which there is a graduated or tapered contact area sizing through the three levels for dividing/applying current on-chip and combining/collecting current off-chip, with distributed contacts over the active area of the GaN power device.

(Continued)

This embedded packaging assembly provides a low inductance, low resistance interconnect structure suitable for devices and systems comprising large area, high power GaN transistors for high voltage/high current applications.

15 Claims, 6 Drawing Sheets

(51) Int. Cl.
| | | |
|---|---|---|
| *H01L 31/02* | (2006.01) | |
| *H01L 29/78* | (2006.01) | |
| *H01L 23/498* | (2006.01) | |
| *H01L 23/482* | (2006.01) | |
| *H01L 29/20* | (2006.01) | |
| *H01L 23/522* | (2006.01) | |
| *H01L 23/532* | (2006.01) | |
| *H01L 23/31* | (2006.01) | |
| *H01L 29/778* | (2006.01) | |

(52) U.S. Cl.
CPC .... *H01L 23/53228* (2013.01); *H01L 29/2003* (2013.01); *H01L 29/78* (2013.01); *H01L 23/3107* (2013.01); *H01L 29/778* (2013.01); *H01L 2224/18* (2013.01)

(58) Field of Classification Search
CPC ......... H01L 23/31; H01L 29/77; H01L 29/66; H01L 31/02
USPC .... 257/192, 76–77, 194, 415, 774, E21.001, 257/E29.324, E29.31, E21.09; 438/669, 438/478, 172
See application file for complete search history.

(56) References Cited

U.S. PATENT DOCUMENTS

| | | | |
|---|---|---|---|
| 9,105,560 B2 | 8/2015 | Roberts et al. | |
| 9,153,509 B2 | 10/2015 | Klowak et al. | |
| 2009/0108437 A1 | 4/2009 | Raymond | |
| 2011/0140172 A1* | 6/2011 | Chu | H01L 29/4175 257/194 |
| 2012/0199875 A1* | 8/2012 | Bhalla | H01L 27/0629 257/134 |
| 2013/0087803 A1* | 4/2013 | Kizilyalli | H01L 29/66462 257/76 |
| 2013/0112985 A1* | 5/2013 | Kizilyalli | H01L 29/8083 257/76 |
| 2014/0159063 A1 | 6/2014 | Odnoblyudov | |
| 2014/0175454 A1* | 6/2014 | Roberts | H01L 25/18 257/76 |
| 2014/0264427 A1 | 9/2014 | Tischler | |
| 2015/0162252 A1 | 6/2015 | Klowak et al. | |
| 2016/0380090 A1* | 12/2016 | Roberts | H01L 29/7787 257/76 |

OTHER PUBLICATIONS

Oknaian, S.—International Rectifier Corporation; article entitled "Power Block Innovations Enhance Synchronous Buck Converters"; Bodo's Power Systems; Oct. 2013; (www.bodospower.com); pp. 36-38.
Zotter, W.; AT&S presentation entitled "3D Component Packaging in Organic Substrate"; Jun. 2012; 33 pages.
AT&S presentation entitled "AT&S Advanced Packaging ECP"; 2013; 18 pages.
GaN Systems Inc.; Application Note entitled "How to Drive GaN Enhancement Mode Power Switching Transistors"; GN001 Rev. Oct. 21, 2014 (Oct. 2014); pp. 1-13.
International Search Report issued on International Patent Application No. PCT/CA2015/000244 dated Jul. 24, 2015; 7 pages.

* cited by examiner

EMBEDDED PACKAGING FOR DEVICES AND SYSTEMS COMPRISING LATERAL GAN POWER TRANSISTORS

CROSS-REFERENCE TO RELATED APPLICATION(S)

This application claims priority from U.S. provisional patent application No. 61/980,101, filed Apr. 16, 2014, entitled "Embedded Packaging with Low Inductance/Low Resistance Interconnect for Large Lateral GaN Power Transistors and Other Nitride Semiconductor Power Devices", which is incorporated by reference in its entirety.

TECHNICAL FIELD

The present invention is related to packaging for devices and systems comprising lateral Gallium Nitride (GaN) transistors, particularly large area GaN power transistors and other high current/high voltage nitride semiconductor devices.

BACKGROUND

GaN devices are expected to be widely adopted for power switches as production costs are reduced, for example, by fabrication of lateral GaN transistors on lower cost silicon substrates (GaN-on-Si die). Lateral GaN power transistors offer low on-resistance, $R_{on}$, and high current capability per unit active area of the device. To benefit from the inherent performance characteristics of lateral GaN transistors, important design considerations include, for example, device layout (topology), low inductance packaging, and effective thermal management.

For larger area lateral switching power transistors capable of switching currents of 20 A or more, using conventional device topologies, where large area contact pads are provided around the periphery of the chip, the length of conductive tracks of on-chip metallization becomes very long. The resistance of the on-chip metallization can be comparable to, or even greater than, the $R_{on}$ of the transistor itself. Furthermore, these long tracks introduce inductance, which significantly degrades the switching performance. Correspondingly, much energy is wasted, which goes simply to heating or overheating of the track. This tends to put an upper limit on the practical size of such power transistors.

The Applicant's PCT International patent application no. PCT/CA2012/000080 entitled "Gallium nitride power devices using island topography", (Roberts et al.), and related applications, disclose GaN switching devices using Island Technology®. This topology mitigates the above mentioned problems. High current is taken directly on and off the chip to/from each island, thus minimizing the length of the on-chip tracks. That is, contact areas are distributed over the active area of the device. This topology provides a low on-resistance ($R_{on}$), low inductance, and a compact structure with a gate width double that of a conventional multi-finger design of a similar device size, with superior current handling per unit area. A breakdown voltage exceeding 1200V can be achieved.

Another large area, multi-island, transistor structure is disclosed in the Applicant's PCT International application no. PCT/CA2014/000762 and U.S. patent application Ser. No. 14/568,507 (Klowak et al.), each entitled "Fault Tolerant Design for Large Area Nitride Semiconductor Devices", which claim priority from U.S. provisional patent application No. 61/896,871, filed 29 Oct. 2013. These patent applications disclose redundant-cell, yield enhancement techniques, which provide a practical approach allows for manufacturing of larger dies. For example, large gate width devices may be fabricated having a current switching capability in excess of 100A.

Nevertheless, to take advantage of these novel structures and other large area, lateral GaN power devices for high voltage/high current applications, improved interconnect and packaging schemes are required. Packaging solutions are required that offer both low inductance interconnections and effective thermal management.

Packaging solutions currently used for power devices typically comprise one of two main types of structures. Firstly, there are a number of industry standard power modules for packaging one or more power devices that are based on conventional wirebond solutions for bare die. For example, the back-side (substrate) of a semiconductor die comprising a power transistor is mounted on a thermal substrate of a power module, using conventional back-side die-attach techniques, such as, soldering or sintering. Then, source, drain and gate connections between the contact pad areas on the front-side of the die and the metal contact areas of the packaging module are then made by conventional wirebonding. External connections of the packaging module may comprise various standard arrangements of pins or leads.

Alternatively, there are many variants of PQFN (Power Quad Flat No Lead) type packages. These packages typically comprise organic or ceramic substrates which provide external metal contact pads, e.g. copper lands, instead of leads or pins. For packaging of vertical power devices, where source or drain contacts may be provided on the back-side of the GaN die, PQFN packages provide a copper die pad and may use wirebonds, copper clips, or flip-chip on leadframe interconnections. For example, some PQFN packages use a copper metal clip to hold the power transistor die in place and provide thermal contact with a thermal substrate.

For lateral GaN power devices, some known drawbacks of these existing packaging solutions include, e.g.:

- a conventional PQFN package for vertical power transistors provides a back-side source connection, and front-side drain and gate connections, whereas for lateral GaN power transistors, all electrical connections, i.e. source, drain and gate contact areas are made to the front-side (top) of the GaN die;
- such PQFN packages are not configured to provide a ground connection between a front-side source contact and the die substrate/thermal pad within the package;
- for lateral GaN power transistors, electrical issues of wirebonding include insufficient current handling and excessive inductance of the long thin lengths of wirebonds;
- wirebonding solutions may require many layers of wirebonds and take up significant space, i.e. they tend to be large in the vertical dimension, which places physical limitations on the design of power modules and requires a thicker, high profile package;
- there is a significant mismatch of CTE (Coefficient of Thermal Expansion) between a GaN-on-Si die and the copper die pad of standard PQFN package or the ceramic substrate of a power module;
- the copper die pad of a standard PQFN package adds extra thermal resistance compared to a bare die on a ceramic substrate of a conventional wirebonded power module.

Thus, there is a need for improved or alternative packaging solutions, which provide for one or more of increased current handling, reduced inductance, provide improved thermal management, and a lower profile package, which can be manufactured at similar or lower cost than existing packaging solutions.

In particular, there is a need for improved packaging schemes for nitride power semiconductor devices, such as GaN power transistors and systems comprising one or more lateral GaN power transistors.

SUMMARY OF INVENTION

The present invention seeks to provide improved or alternative packaging and interconnect for nitride semiconductor devices, such as GaN power transistors and systems comprising one or more GaN power transistors.

Aspects of the invention provide embedded packaging for devices and systems comprising nitride power semiconductor devices, such as GaN power transistors and systems comprising one or more lateral GaN power transistors.

One aspect of the invention provides a semiconductor device structure comprising an assembly of: a semiconductor device comprising one or more lateral GaN power transistors fabricated on a semiconductor substrate (GaN chip) and a package; the GaN chip being embedded the package, and said assembly of the GaN chip and package comprising first, second and third level interconnect comprising conductive interconnect layers and intervening dielectric insulating layers; the first level interconnect comprising on-chip metallization providing an array of a plurality of contacts distributed over an active area of the device to provide source contacts, drain contacts and gate contacts for said one or more lateral GaN power transistors; overlying the first level interconnect, and over the active area of the device, the second level interconnect comprising second level metallization providing large area conductive contacts, interconnecting sets of the underlying array of the plurality of contacts of the first level interconnect; and overlying the second level interconnect and over the active area of the device: the third level interconnect comprising third level metallization providing even larger area conductive contacts to the underlying large area contacts of the second level interconnect, with the third level interconnect extending laterally of the underlying second level of interconnect.

Another aspect of the invention provides a semiconductor device structure comprising:

a GaN power switching device comprising a lateral GaN power transistor fabricated on a semiconductor substrate (GaN die);

the GaN die comprising an on-chip metallization layer defining source, drain and gate contact areas on a front-side of the GaN die, said source and drain contact areas being distributed over an active area of the lateral GaN power transistor and providing a first level of interconnect to a plurality of underlying source and drain electrodes of the lateral GaN power transistor;

an overlying second level of interconnect comprising a dielectric layer formed on the GaN die defining contact openings to the underlying source, drain and gate contact areas of the on-chip metallization layer and a second metallization layer formed thereon defining a source contact area, a drain contact area and one or more gate contact areas, the thickness and lateral dimensions of the source contact area and drain contact area of the second metallization layer being greater than those of the underlying source and drain contact areas of the on-chip metallization layer; and packaging components comprising one or more dielectric layers forming a dielectric body of a package and package metallization;

the GaN chip and overlying second level of interconnect being embedded in the dielectric body of the package with the dielectric body of the package extending laterally around the GaN die;

the package metallization comprising:

an overlying metal layer and an underlying metal layer sandwiching the dielectric body of the package, the overlying metal layer extending over a front-side of the dielectric body and the underlying metal layer extending over a back-side of the dielectric body, the overlying metal layer being patterned to define large area source and drain contact areas extending laterally of the underlying GaN die, and one or more gate contact areas;

the underlying metal layer being patterned to define a thermal pad underlying a back-side of the GaN die, and an external source contact pad, an external drain contact pad, an external gate contact pad, an external source sense pad, each laterally spaced from the thermal pad;

the respective source, drain and gate areas of the second metallization layer on the GaN die being electrically interconnected vertically through the dielectric body of the package with the corresponding source, drain and gate contact areas of the overlying metal layer of the package metallization;

the respective source, drain and gate areas of the overlying metal layer being interconnected vertically through the dielectric body of the package with corresponding external source, drain, and gate contact pads source of the underlying metal layer of the package metallization;

and the back-side of the GaN die being thermally coupled to the thermal pad.

Thus, the back-side of the package provides an external thermal pad and external pads for source, drain, and gate, and preferably also provides a source sense pad. The back-side of the GaN dies is also preferably electrically interconnected with the thermal pad, i.e. grounded to the source/substrate.

Where the on-chip metallization comprises a plurality of conductive tracks or fingers for each of the source and drain contacts, the metallization of the second level interconnect preferably comprises a plurality of tapered fingers. The tapered fingers extend laterally of the underlying source and drain contact areas of the on-chip metallization layer to provide larger area source and drain contacts, which are tapered to collect or distribute current taken off-chip or on-chip from underlying smaller area source and drain contact areas. The source and drain contact areas provided by the overlying metal layer of the package metallization may also each comprise a corresponding plurality of tapered fingers, matched to the underlying tapered fingers of the second metallization layer. The overlying package metallization also extends laterally of the GaN die for interconnection through the package body to the underlying package metallization layer.

In a preferred embodiment, the metallization of the second level of interconnect comprises a copper redistribution layer and the dielectric comprises a polyimide dielectric. The package metallization forms a third level of interconnect comprising the overlying and underlying metallization layers of the package metallization. The latter each comprise a thick plated copper layer or one or more copper foil layers and the dielectric body of the package comprises one or more layers of a prepreg type dielectric, e.g. a high temperature fiberglass material, such as, FR4.

The dimensions of the conductors or tracks of conductive contacts provided by the metallization layers of first, second and third level interconnects increases from: typically 3 μm-100 μm laterally, and ~5 μm thick, for the first level interconnect comprising the on-chip metal layer, e.g. aluminum; to 50 μm-500 μm laterally, and ~5-10 μm thick, for the second level interconnect, e.g. Cu RDL; to several mm laterally, ~40 μm or more thick, for the third level interconnect, e.g. plated copper or copper foil layer. The lateral dimensions of the third level interconnect metallization or package metallization are typically larger than the die itself because this provides the electrical connections from the device structure to the outside world. Thus, a graduated or tapered interconnect scheme is provided.

When, for example, the metallization of the second level interconnect is a copper redistribution layer (RDL) and the metallization of the third level interconnect is an overlying thicker copper foil layer, and the copper RDL and overlying thicker copper foil layer may be interconnected vertically by conductive interconnect in the form of a plurality of copper pillars or posts. The dielectric between the on-chip metallization and the second level interconnect may be polyimide. The dielectric forming the package body, in which the GaN chip is embedded, may be a prepreg type dielectric layer or layers, such as FR4.

Accordingly, a large current is carried onto the chip through the larger area contacts of the package metallization, distributed or divided by the second level interconnect into the plurality of large area contacts of the second level interconnect and then further divided and fed on-chip through the array of contacts to the on-chip metallization. A large current is similarly collected/combined when taken off-chip.

In an embodiment, the thick copper layer of the third level interconnect comprises a plurality of tapered fingers so that as current is collected/combined from multiple underlying contacts, for each of the source and drain contacts, the contact area of the copper layer widens.

Similarly, the copper RDL layer of the second level interconnect may also provide large area contacts for each of the source and drain, with similarly tapered fingers.

The first level interconnect, i.e. that provided by the on-chip metallization, comprises one or more metallization layers with metal traces of smaller dimension. This layer may have any suitable configuration, such as a two dimensional array of alternating source and drain island contacts for Island Technology. Alternatively, respective source and drain contacts can comprise a more conventional arrangement of interdigitated fingers for contacting each of the respective source and drain islands. One or more gate contact areas are also provided for contacting interconnected gate elements of a large Wg gate electrode. The on-chip metal traces of the first level interconnect are typically aluminum and have a width of about 3 μm to 100 μm.

As is conventional, during wafer fabrication, a passivation layer is provided over the on-chip interconnect metallization, with contact openings to each of on-chip contact areas. For example, fingers of on-chip interconnect metallization make contact with a respective underlying array source and drain contact areas and gate contact areas.

During wafer post-processing, when the second metallization layer comprises Cu RDL, a suitable the dielectric layer between the on-chip metallization and Cu RDL is polyimide, for example.

The dielectric forming the package body may be a prepreg type dielectric layer or layers typically used with thick copper, such as FR4. The FR4 dielectric extends around sides of the GaN chip, so that the chip is embedded in the dielectric package. Copper pillars may be used to vertically interconnect the overlying metal layer of the package to the underlying RDL layer.

This graduated/tapered three level interconnect arrangement provides the required low resistance, low inductance, off-chip interconnect, cost-effectively integrated into the package. It provides for large current handling capability without the need for large on-chip pads.

This packaging solution effectively builds on Island Technology, and redundant cell yield enhancement techniques, as disclosed in the above referenced patent applications, and can also be advantageous for use with conventional large area power transistor topologies.

The package assembly may also include a back-side copper layer or copper foil providing a back-side heat-plate or thermal pad to which the die is attached for thermal dissipation. The back-side copper layer may provide a substrate connection only, i.e. not carrying significant current to source or drain. Preferably, the back-side copper layer may also be suitably patterned to provide back-side external contact pads for source and drain connections from the third level interconnect, e.g. through a plurality of copper pillars or a bulk solid copper connections extending through the FR4 dielectric.

In some embodiments, multiple chips may be embedded together within the package. For example two GaN chips packaged as described above may be embedded side-by-side, and interconnected by the second level interconnect metal and/or package metallization to form a half-bridge circuit. Alternatively, a GaN chip may be co-packaged with a MOSFET driver chip.

Thus improved packaging and interconnect structures are provided for nitride semiconductor devices, such as GaN power transistors and systems using one or more GaN power transistors.

BRIEF DESCRIPTION OF THE DRAWINGS

In the drawings, identical or corresponding elements in the different Figures have the same reference numeral, or corresponding elements have reference numerals incremented by 100 in successive Figures.

The foregoing and other objects, features, aspects and advantages of the present invention will become more apparent from the following detailed description, taken in conjunction with the accompanying drawings, of embodiments of the invention, which description is by way of example only.

DETAILED DESCRIPTION OF EMBODIMENTS

Schematic diagrams of a semiconductor device structure 100 according to a first embodiment of the invention, comprising an assembly of a semiconductor chip 102 comprising a large area, lateral GaN power transistor and a plurality of packaging components, are shown in FIG. 1 and FIGS. 2A, 2B, 2C and 2D.

The semiconductor chip 102 comprises a substrate, e.g. silicon, on which gallium nitride semiconductor layers are fabricated to define one or more GaN devices, e.g., a large area, lateral GaN power transistor. This semiconductor chip 102 is referred to herein variously as a GaN-on-Si chip, GaN chip or GaN die. The GaN chip may be fabricated using Island Technology®. For example, the GaN power transistor comprises a GaN/AlGaN heterolayer forming a Two Dimensional Electron Gas (2DEG) active region, an array of source island electrodes and drain island electrodes formed over the active region, and a large gate width ($W_g$) gate electrode. Reference is made to the above referenced patent applications (Roberts et al. and Klowak et al.) for examples of GaN power transistor structures comprising island electrodes. The GaN chip may optionally further comprise integrated driver circuitry. As an example only, the size of the GaN chip 102 for a large area, lateral GaN power transistor having a gate width $W_g$ of 300 mm may be, for example, about 4 mm×6 mm or 5 mm×7 mm.

Figure 1:
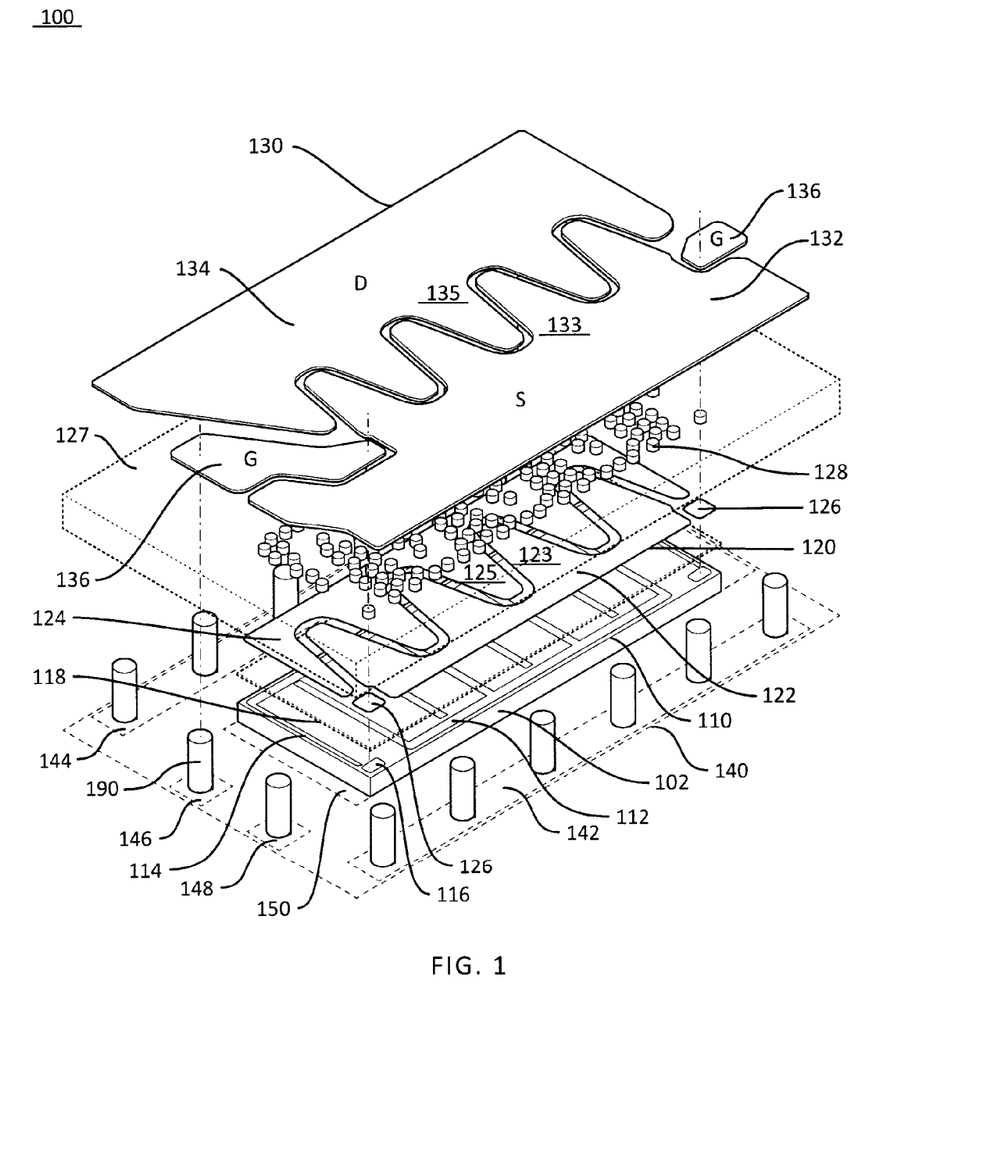
FIG. 1 shows a schematic exploded isometric view of parts of a packaging assembly for a semiconductor chip comprising a lateral GaN power transistor according to a first embodiment.

After completion of the wafer fabrication steps, each GaN-on-Si chip 102 comprises on-chip metallization layer 110, typically aluminum (Al), aluminum alloy, or e.g. aluminum/titanium which is patterned as illustrated in FIG. 1 to provide external contacts areas for the underlying source, drain and gate electrodes of the GaN transistor. As illustrated, in this embodiment, the on-chip metal layer 110 takes the form of a source contact 112 and a drain contact 114, each comprising a plurality of metal tracks or fingers extending over the surface, which interconnect respective underlying source island electrodes and drain island electrodes of the GaN transistor (see also FIG. 5A). There is also at least one gate contact 116. The on-chip metallization layer 110 forms the first level of interconnect of a three level interconnect structure of the semiconductor device structure 100 which comprises the GaN chip and a plurality of components of the packaging assembly.

The first level interconnect tracks provided by the on-chip metallization layer 110 are made as substantial as possible to provide low resistance/low inductance interconnections for high current capability. However, the layout and lateral dimensions and thickness of the on-chip metal 110 forming the tracks for source contact 112, drain contact 114 and gate contact 116 are typically constrained by design rules of the particular process technology used for wafer fabrication. For example, the dimensions of the on-chip metal tracks forming this first level interconnect are typically 3 µm-100 µm laterally, and ~5 µm thick. The dimensions of the on-chip metal tracks therefore limit their current handling capability.

To enable large currents to be taken on-chip and off-chip over the active area of the GaN transistor, an overlying second level of interconnect 120 defines a large area source contact area 122 and a large area contact area 124. This requires post-processing of the wafer, using another metallization process that is capable of providing a second level of interconnect 120 comprising thicker, larger areas of metallization. For example, the second level of interconnect 120 comprises a copper redistribution layer (Cu RDL). The dimensions of the latter may be 50 µm-500 µm laterally, and ~5-10 µm thick.

As illustrated in FIG. 1, there is an insulating dielectric layer, such as polyimide layer 118, overlying the on-chip metallization 110. The polyimide layer 118 is patterned with contact openings (see FIG. 2C) which extend through the polyimide layer 118 to the respective source, drain and gate contact areas (112, 114 and 116 respectively) of the underlying first level of interconnect provided by the on-chip metallization 110. The second conductive metallization layer 120 is provided thereon, extending through the contact openings in the polyimide layer 118. The second metallization layer 120 electrically contacts the respective underlying contact areas of the on-chip metallization 110. In this embodiment, the Cu RDL 120 is patterned to form a large area source contact area 122 and large area drain contact area 124. The source and drain contact areas 122 and 124 of the Cu RDL 120 comprise tapered fingers, 123 and 125 respectively, that extend over and directly contact the underlying layers of on-chip metallization 110 that form the corresponding source and drain contacts 112 and 114 of the underlying GaN-on-Si chip 102. The tapered fingers 123 and 125 of the source contact area 122 and drain contact area 124 distribute current taken on-chip or off-chip through the respective source and drain contact areas 112 and 114 of underlying first level of metallization 110. Thus, as illustrated in the front-side view of FIG. 5B, the GaN-on-Si chip 102 with Cu RDL 120 provides larger area source and drain contact areas 122 and 124, respectively, and gate contact areas 126, which enable low inductance electrical interconnections to be made to other conductive elements of the packaging.

Referring back to FIG. 1, the packaging components of the assembly comprise a dielectric body 127 in which GaN-on-Si chip 102 is embedded, and a third level of interconnect comprising overlying and underlying thick metal layers, i.e. copper foil layers 130 and 140. Each of the copper foil layers 130 and 140 are patterned to define source, drain and gate contact areas.

Figures 2A, 2B:
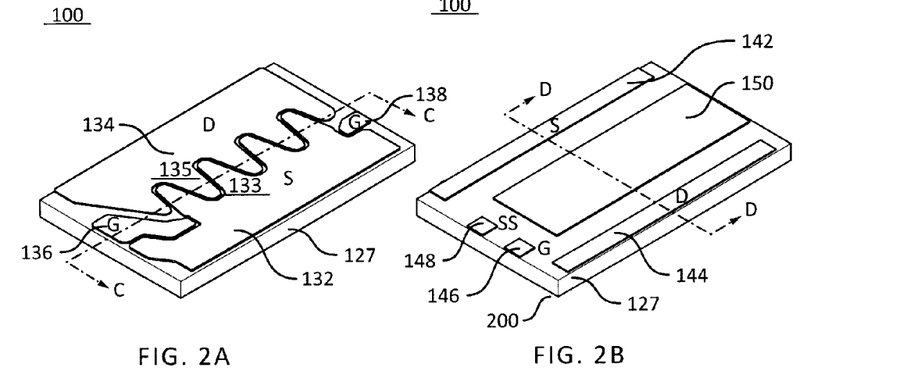
FIG. 2A shows a schematic isometric view of a front-side of the packaging assembly of the first embodiment.
FIG. 2B shows a schematic isometric view of a back-side of the packaging assembly of FIG. 2A.
Figure 2C:
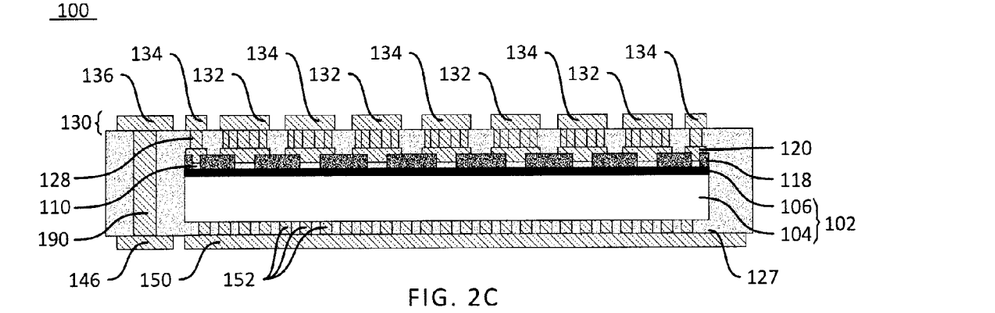
FIG. 2C shows a schematic cross-sectional view of the semiconductor chip and packaging assembly through line C-C of FIG. 2A.
Figure 2D:
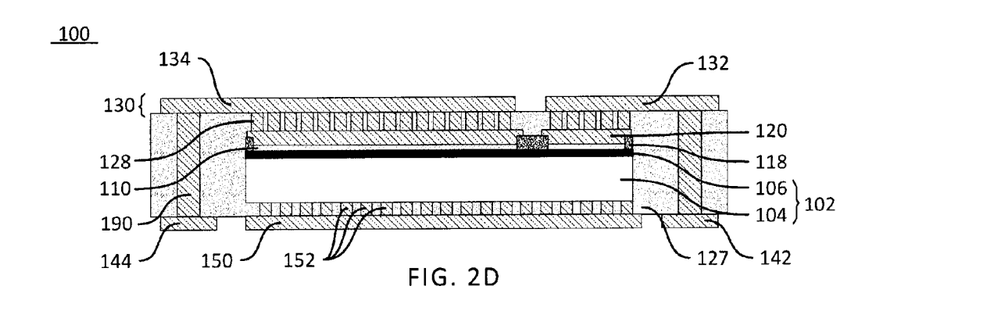
FIG. 2D shows a schematic cross-sectional view of the semiconductor chip and packaging assembly through line D-D of FIG. 2B.

As illustrated in FIG. 1, and the cross-sectional views of FIGS. 2C and 2D, the dielectric body of the package 127 comprises one or more layers of a prepreg type dielectric material, i.e. a high temperature fiberglass material, such as FR4. This material forms the body 127 of the packaging assembly in which the GaN-on-Si chip 102 is embedded.

The overlying layer of copper foil 130 and underlying layer of copper foil 140 extend over the dielectric material 127 which forms the package body, in which the chip 102 is embedded. The overlying copper foil layer 130 is patterned to define a large area source (S) contact area 132, a large area drain (D) contact area 134, and gate (G) contact areas 136. The source contact areas 132 has tapered fingers 133 and the drain contact area has tapered fingers 135, which extend over the corresponding tapered source fingers 123 and drain fingers 125 of the second interconnect level, the Cu RDL 120. The underlying copper foil layer 140 is patterned to define an external source contact pad 142, an external drain contact pad 144, a gate contact pad 146 and a source-sense (SS) contact pad on the back-side of the package assembly. The copper foil layer 140 also provides a thermal pad 150 over which the back-side of the GaN-on-Si chip is placed. The copper foil layer 130 extends extend laterally beyond the sides of the GaN chip to provide large area contact areas for the source and drain and gate on the front-side of the packaging assembly, which are interconnected through the dielectric layer 127 to respective external pads of copper foil layer 140, by copper pillars 190 arranged around the periphery of the package assembly.

To electrically interconnect the second level of interconnect (Cu RDL) 120 with the overlying copper foil layer 130 of the third level of interconnect, contact openings are provided through the FR4 dielectric layer 127 for metal interconnect 128. In this embodiment, the interconnect 128 comprises an array of a plurality of copper posts or pillars. For example, a plurality of contact openings may be defined through the dielectric layer 127, into which copper is deposited to form a plurality of copper pillars 128. Alternatively copper posts 128 may be provided and the dielectric material 127 formed around the posts.

Larger copper pillars 190 are provided to interconnect the overlying copper foil layer 130 and underlying copper foil layer 140 through the periphery of the package body 127. That is, source and drain areas 132 and 134 of copper foil layer 130 are interconnected through the FR4 layers to respective the source and drain external pads 142 and 144 of copper foil layer 140, by copper pillars 190.

When the components shown in FIG. 1 are assembled, the assembly of the GaN-on-Si chip 102 and the packaging elements provide a package in which the GaN-on-Si chip is embedded, as shown schematically in FIG. 2A, with large area contact areas 132 (S), 134 (D) and 138 (G) provided by the patterned copper foil layer 130 on the top side of the package assembly. The source contact area 132 comprises tapered fingers 133. The drain contact area 134 comprises tapered fingers 135. External contact pads 142 (S), 144 (D), 146 (G) and 148 (SS) are provided by the patterned copper foil layer 140 on the back-side of the package assembly, as shown schematically in FIG. 2B. Also visible on the back-side of the package 100 is the large thermal pad 150 which is in thermal and electrical contact with the back-side of the embedded GaN-on-Si chip.

FIG. 2C shows a schematically cross-sectional view of the packaging assembly through line C-C of FIG. 2A. FIG. 2D shows a schematically cross-sectional view of the packaging assembly through line D-D of FIG. 2B.

As shown in the schematic cross-sectional view of FIG. 2C, the GaN-on-Si chip 102, comprising the silicon substrate 104 and GaN device layers 106 is embedded in the dielectric material 127 of the package. The on-chip metal layer 110 defines source, drain and gate contact areas for the GaN device layers 106. A first dielectric layer 118, e.g. polyimide is provided on the chip, with contact openings through the dielectric layer 118 to the source, drain and gate contact areas defined by the on-chip metal layer 110. The overlying second level of interconnect comprising metallization layer 120, provided by the Cu RDL, defines larger and thicker contact areas, which are laterally isolated by parts of the polyimide dielectric 118 and FR4 dielectric 127. The third metallization level, i.e. package metallization, comprises the copper foil layers 130 and 140 of the package. The copper foil layer 130 is patterned to define source contact areas 132 and drain contact areas 134. These contact areas 132 and 134 are interconnected to the underlying copper RDL by copper interconnect comprising a plurality of copper posts 128. The underlying copper foil layer 140 is patterned to define the thermal pad 150, and external gate pad 146. As shown in the cross-section of FIG. 2C, the gate contact area 136 is interconnected to the external gate contact pad 146 by one of the copper pillars 190. Another plurality of copper posts 152 are provided to provide thermal and electrical contacts between the back-side metallization of the silicon substrate 104 of the GaN chip 102 and the thermal pad 150.

As shown in the cross-sectional diagram of FIG. 2D, through line D-D of FIG. 2B, the GaN-on-Si chip 102, comprising the silicon substrate 104 and GaN device layers 106 is embedded in the dielectric material 127 of the package. The on-chip metal layer 110 defines source and drain contact areas for the GaN device layers 106. A first dielectric layer 118, e.g. polyimide is provided on the chip, with contact openings 119 through the dielectric layer 118 to the source and drain contact areas defined by the on-chip metal layer 110. The overlying second level metallization 120, comprising the Cu RDL, defines larger and thicker contact areas, which are laterally isolated by parts of the polyimide dielectric 118 and FR4 dielectric 127. The third level metallization comprises the copper foil layers 130 and 140. The copper foil layer 130 is patterned to define source contact area 132 and drain contact area 134, that are interconnected to the underlying copper RDL 120 by copper interconnect comprising a plurality of copper posts 128. The underlying copper foil layer 140 is patterned to define the thermal pad 150, and external gate source pad 142 and drain pad 144. The source contact area 132 is interconnected to the external source contact pad 142 by copper pillar 190. The drain contact area 134 is interconnected to the external drain contact pad 144 by another copper pillar 190. The plurality of copper posts 152 provide thermal and electrical contact between the back-side of the GaN-on-Si chip 102 and the thermal pad 150.

Figure 3A:
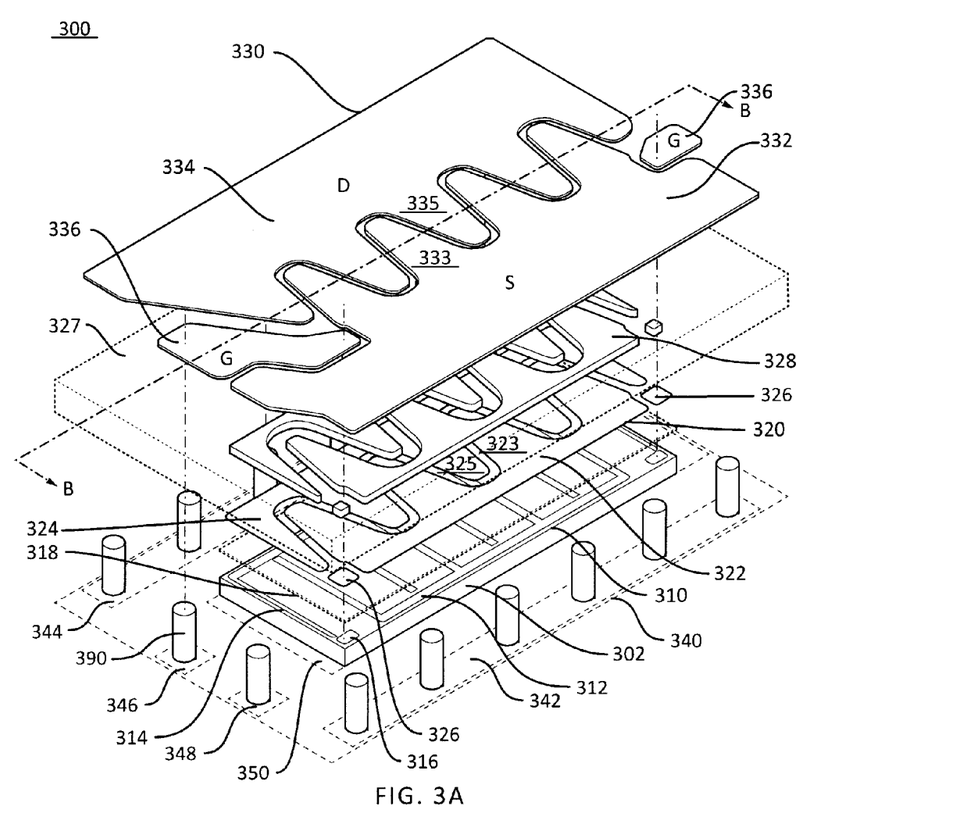
FIG. 3A shows a schematic exploded view of parts of a packaging assembly and a semiconductor chip comprising a lateral GaN power transistor, according to a second embodiment.
Figure 3B:
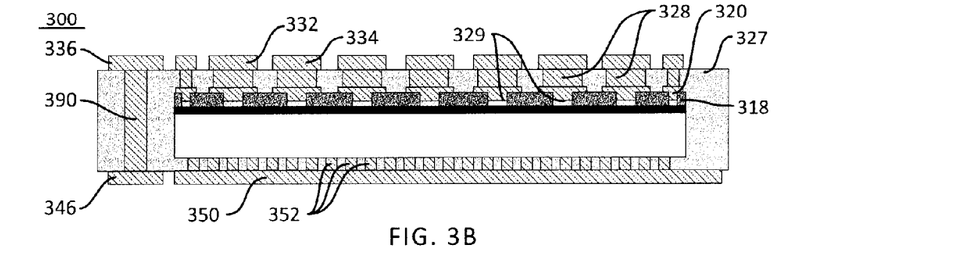
FIG. 3B shows a schematic cross-sectional view, through line B-B of FIG. 3A, of the packaging assembly and semiconductor chip of the second embodiment.

A semiconductor device structure 300 comprising an assembly of a semiconductor chip comprising a large area lateral GaN power transistor and packaging components, according to a second embodiment of the invention, is illustrated schematically in the exploded isometric view in FIG. 3A, and the cross-sectional view of FIG. 3B. Some elements of this device structure are similar to those of device structure 100 of the first embodiment and corresponding parts have similar reference numerals, incremented by 200. That is, the GaN chip 302 comprises a silicon substrate 304 and overlying GaN semiconductor layers 306, defining a large area lateral GaN power transistor. The GaN chip 302 comprises a first level of interconnect comprising on-chip metallization 310. The second level of interconnect comprises an insulating dielectric layer of polyimide 318 and copper RDL 320. Packaging components comprise a thick dielectric layer 327 comprising one or more layers of FR4 forming the body of the package in which the chip 302 is embedded. The third level of interconnect comprises overlying and underlying copper foil layers 330 and 340. However, in this embodiment, as illustrated in FIGS. 3A and 3B, the interconnect 328 between the copper redistribution layer 320 and the overlying thick copper foil layer 330 is provided by a large area patterned copper layer 328, instead of an interconnect layer comprising an array of copper posts 128 used in the first embodiment. The copper interconnect layer 328 is patterned to match the underlying source, drain and gate contact areas of the underlying copper redistribution layer 320, which comprises tapered fingers 323 and 325. The overlying copper foil layer 330 also comprises tapered fingers 333 and 335. Similar to the structure of the first embodiment, a back-side copper layer 340 is patterned to define the external contact pads 342, 344, and 346, for source, drain and gate respectively, source sense pad 348 and a thermal pad 350.

Thus, as illustrated in the cross-sectional view in FIG. 3B, in the structure of the second embodiment, vias or contact openings 329 are provided through the polyimide layer 318 to expose the underlying on-chip metal layer 310. The Cu RDL 320 fills the contact openings 329 to provide large area source and drain interconnects 328. The overlying copper layer 328 is patterned similarly to Cu RDL 320 and interconnects the underlying RDL 320 with overlying the thick copper foil layer 330. Similar to the structure of the first embodiment, the thick back-side copper foil layer 340 is patterned to define the external contact pads, of which gate contact pad 346 and thermal pad 350 are shown in FIG. 3B. Also shown in FIG. 3B is a copper post 190 interconnecting gate contact areas 336 and 346.

Figure 4A:
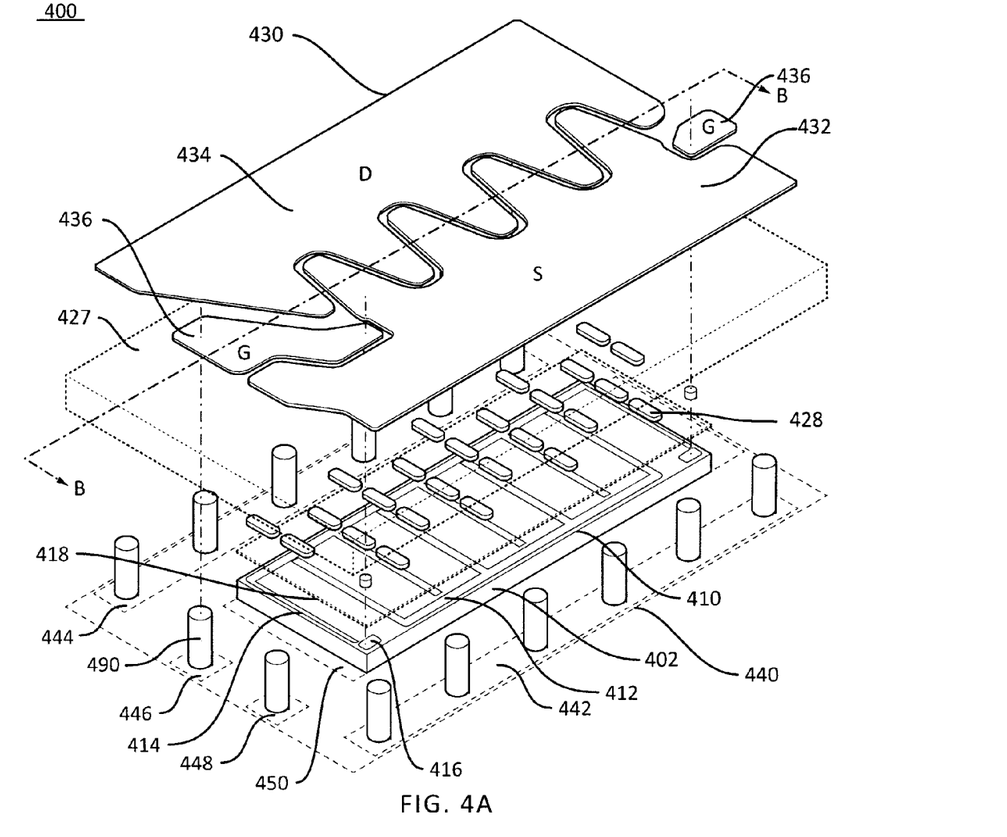
FIG. 4A shows a schematic exploded view of parts of a package assembly and a semiconductor chip comprising a lateral GaN power transistor, according to a third embodiment.
Figure 4B:
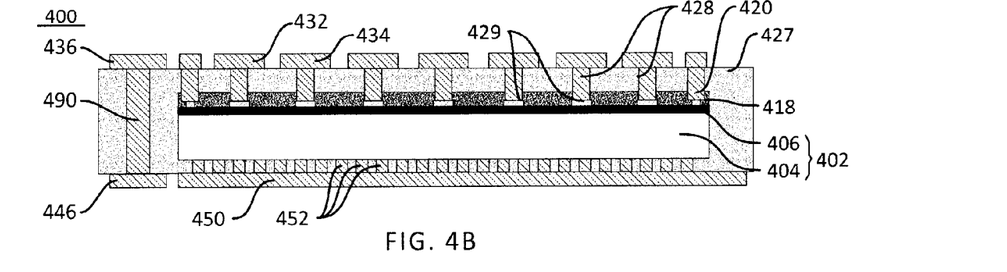
FIG. 4B shows a schematic cross-sectional view, through line B-B of FIG. 4B, of the package assembly and a semiconductor chip of the third embodiment.

A semiconductor device structure 400, comprising an assembly of a semiconductor chip comprising a large area lateral GaN power transistor and packaging elements, according to a third embodiment of the invention, is illustrated schematically in the exploded perspective view in FIG. 4A, and the cross-sectional view of FIG. 3B. Some elements of this device structure are similar to those of the semiconductor device structure 100 of the first embodiment and corresponding elements have the same reference numerals incremented by 300. That is, GaN chip 402 comprises a silicon substrate 404, and overlying GaN semiconductor layers 406 defining a large area lateral GaN power transistor. The GaN chip 402 comprises a first level of interconnect comprising on-chip metallization 410. The second level of interconnect comprises an insulating dielectric layer of polyimide 418 and copper RDL 420. A thick dielectric layer 427 comprising one or more layers of FR4 forms the body of the package, which is sandwiched between a third level interconnect comprising underlying and overlying copper foil layers 430 and 440. However, in this embodiment, as illustrated in FIGS. 4A and 4B, the copper redistribution layer (Cu RDL) 420 is thicker than in the first and second embodiments, and it is patterned to form a plurality of copper interconnect posts 428. These Cu RDL interconnect posts 428 are electrically interconnected to the underlying areas of the on-chip metal 110 of first level interconnect and the overlying areas of the thick copper foil layer 430 of the package of the third level of interconnect. Similar to the structure of the first embodiment, the back-side thick copper layer 440 is patterned to define the external contact pads 442, 444, and 446, for source, drain and gate respectively, source sense pad 448 and a thermal pad 450.

Thus, as illustrated in the cross-sectional view in FIG. 4B, in the structure of the third embodiment, contact openings 423 are provided through the polyimide layer 418 to expose the underlying on-chip metal layer 410. The Cu RDL 420 fills the contact openings 423 and is patterned provide the plurality of posts 428. The Cu posts 428 interconnect respective source, drain and gate contact areas of the on-chip metal 110 and the overlying thick copper layer 430. Similar to the structure of the first and second embodiments, the thick back-side copper foil layer 440 is patterned to define the external contact pads, of which gate contact pad 446 and thermal pad 450 are shown in FIG. 4B. Also shown in FIG. 4B is a copper post 190 interconnecting gate contact areas 436 and 446. The thermal pad 450 is thermally connected to the back-side of the GaN-on-Si chip 102 by copper thermal vias 452.

Processing

By way of example, processing steps of a method for fabricating a packaging assembly of the first embodiment are illustrated schematically in FIGS. 5A to 5D. Overall, processing involves three stages:

1. Wafer Fabrication: providing a finished wafer (GaN-on-Si wafer) comprising a plurality of GaN-on-Si die, comprising on-chip metal defining source, drain and gate contact areas of each die (first level of interconnect).
2. Post-processing of the GaN-on-Si wafer: providing and patterning a copper redistribution layer (Cu RDL) defining large area source, drain and gate contact areas (second level of interconnect) for each die, and dicing of the wafer to provide individual GaN-on-Si chips.
3. Packaging of the singulated GaN-on-Si chips: Assembly of packaging components comprising a dielectric package body and overlying and underlying metal foil layers, and interconnection of internal source, drain and gate contract areas to back-side external source, drain and gate pads (third level of interconnect) and die attach to the thermal pad.

Figure 5A:
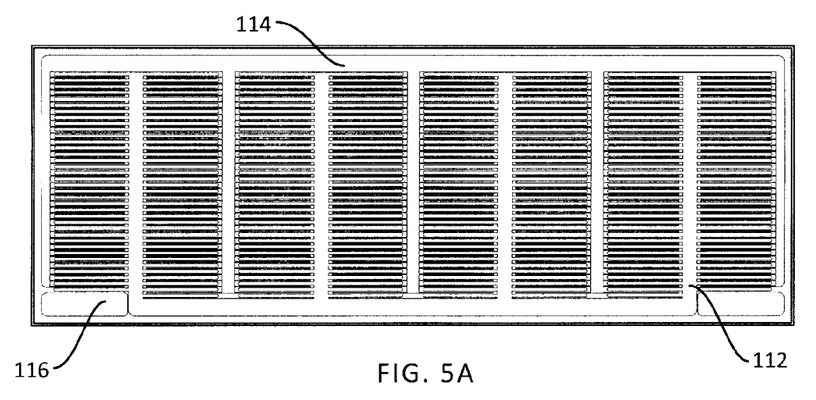
FIGS. 5A to 5E illustrate schematically steps in a method of fabrication of a package assembly for a semiconductor chip according to the first embodiment.

Wafer Fabrication:

FIG. 5A illustrates schematically a top view of one GaN-on-Si chip 102 after completion of conventional chip fabrication steps to provide an on-chip metal layer 110 which defines metal tracks for the source contact area 112, drain contact area 114, and gate contact areas 116 of the GaN-on-Si chip. In this embodiment, the source and drain metal tracks 112 and 114 comprise interdigitated source and drain fingers to form a large gate width GaN transistor.

Figure 5B:
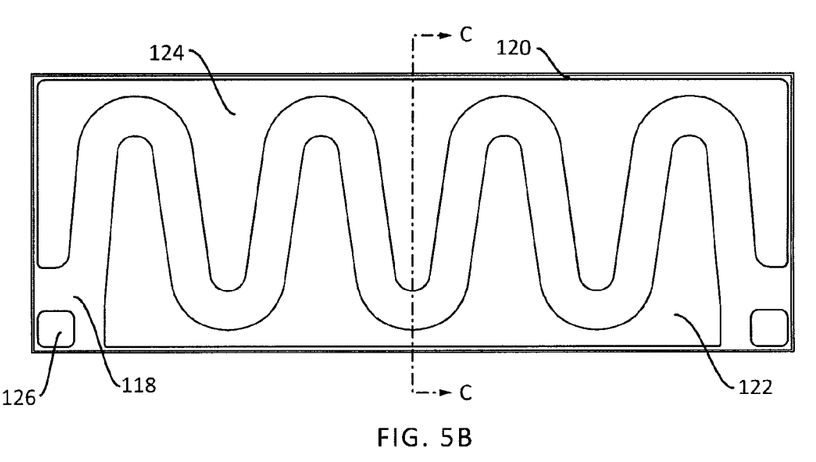

Wafer Post-processing:

FIG. 5B shows schematically a top view of the GaN-on-Si die of FIG. 5A after providing thereon a second level of interconnect comprising the Cu RDL 120. During post-processing of the Ga—N chip, a dielectric layer of polyimide 118 is applied to the chip and patterned to open contact openings to the underlying on-chip metal layer 110, and the Cu RDL is applied and patterned to define the large source contact area 127, drain contact area 124 and gate contact areas 124, as shown schematically in FIG. 5B. Post-processing may also include other conventional post-processing steps, such as, back-side thinning of the wafer and application of a back-side metal layer for die attach. The wafer is then diced to provide individual GaN-on-Si chips 102, comprising on-chip metal 110 and overlying Cu RDL 120. This structure is shown schematically in cross-section in FIG. 5C, through line C-C of FIG. 5B.

Figure 5C:
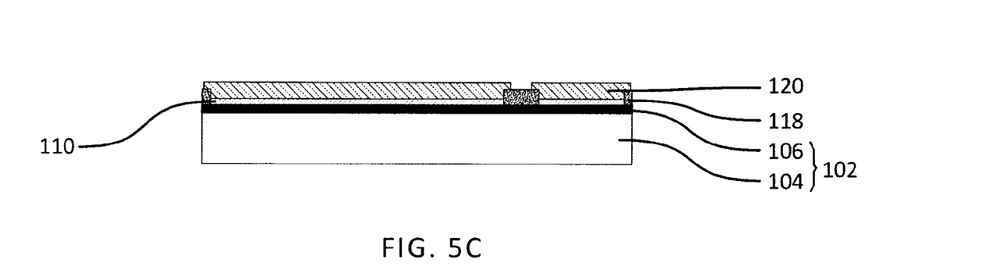
Figure 5D:
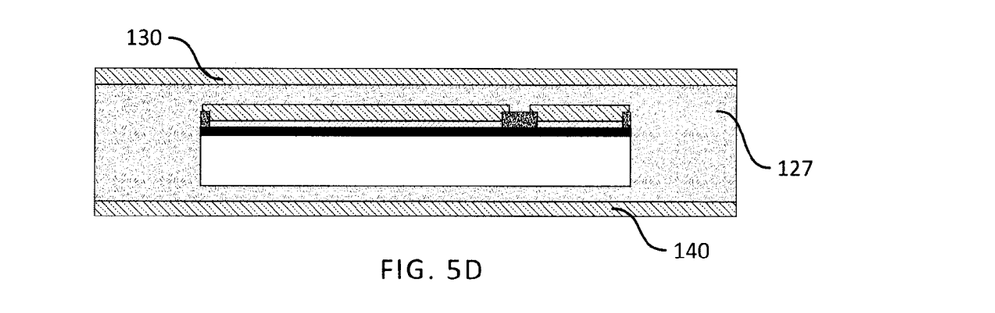
Figure 5E:
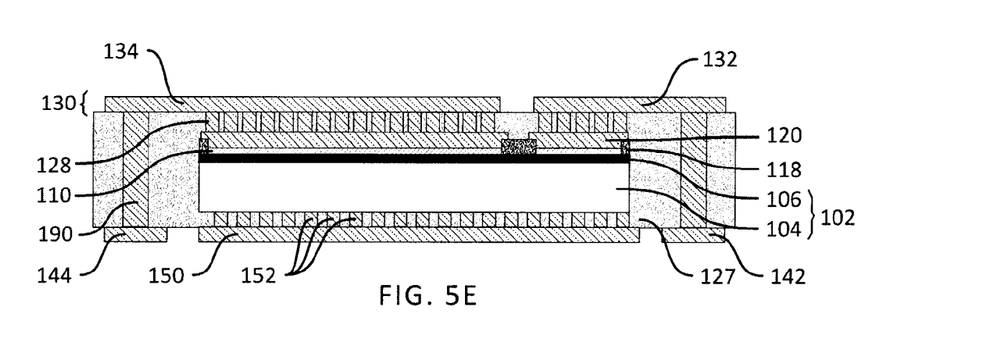

Thus, FIG. 5C shows in cross-section the GaN-on-Si chip 102, comprising the silicon substrate 104 and overlying GaN layers 104, the on-chip metal layer 110, the polyimide layer 118, and Cu RDL 120.

Packaging:

Each individual GaN-on-Si chip is embedded in one or more layers of package dielectric 127, i.e. high temp fiber-glass (FR4) as illustrated schematically in the cross-sectional view of FIG. 5C. The dielectric layer material 127 extends over and under the GaN-on-Si chip to completely embed it. The package dielectric layers 127, with the embedded GaN-on-Si chip(s) 102 are then sandwiched between overlying and underlying package metal layers 130 and 140, each comprising a thick copper foil layer which extends over the front and back surfaces of the package body.

Subsequently, the overlying (front-side) copper foil layer 130 is patterned to define the large area contact areas 132, 134 and 136, for the source, drain and gate respectively, as shown in FIG. 2A. The source and drain contact areas 132 and 134 are seen in the cross section of FIG. 5C. The underlying (back-side) copper foil layer 140 is patterned to define the thermal pad 150 and external contact pads 142, 144, 146, 148 for the source, drain, gate and source sense respectively, as shown in FIG. 2B. The source and drain pads 142 and 144, and thermal pad 150 are seen in the cross-section of FIG. 5C.

Interconnection of the source, drain and gate contact areas of the Cu RDL on the GaN-on-Si chip and the respective source drain and gate contact areas of package interconnect comprising copper foil layer 130 is accomplished by forming copper pillars and/or posts as described above with reference to FIG. 1, and FIGS. 2A to 2D.

In one embodiment, these interconnect pillars and posts, are provided by opening sets of vias through contact areas defined by the overlying and underlying copper foil layers, to respective contact areas and then plating copper therein, to form conductive copper pillars and/or posts. For small copper posts 128, interconnecting the overlying copper foil layer 130 to respective contact areas of the Cu RDL layer 120, small dimension vias extending through the copper foil layer 130 to the Cu RDL are formed by laser drilling. For copper pillars 190, larger through hole vias, extending from copper layer 130 through the dielectric to copper layer 140, are formed by conventional drilling techniques. For thermal copper posts 152, which also provide electrical contact with the back-side of the chip 102, another set of small vias is opened through the underlying copper foil layer 140 through to the back-side metal of the chip 102. The vias are filled by copper plating to form the copper pillars and posts, 128, 152 and 190.

Typically, for volume production, batch processing is used in which large sheets of dielectric layers 127 are patterned for embedding multiple GaN-on Si chips 102. After applying and patterning the copper foil layers 130 and 140, the interconnections comprising the copper pillars and posts are formed as described above using an appropriate drilling and plating process. The sheet is then cut to separate the individual packaging assemblies each comprising an individual embedded GaN-on-Si chip.

As is conventional, the packaging assembly may be finished with a covering or encapsulation layer (not shown). This covering protects the contact areas on the front-side of the package and provides an area for labelling. The external contact pads for the source, drain, gate and source sense (142, 144, 146 and 148 in FIG. 2B), and the thermal pad (150 in FIG. 2B) are left exposed on the back-side of the package. Thus the package may be mounted on an underlying thermal substrate, e.g. on a printed circuit board providing thermal vias for heat dissipation from the external thermal pad of the package, and corresponding source, drain, gate and source sense contact areas for electrical connections.

Alternative Embodiments

As will be appreciated, while specific embodiments have been described above, modifications or variants of these embodiments may be provided. In particular, as shown in the embodiments described above, alternative arrangements may be used for interconnecting the conductive elements of the second level interconnect and the third level interconnect, using various arrangements of conductive layers and conductive posts or pillars. The packages may be assembled using other process sequences. For example, openings for the interconnect pillars and posts may be pre-drilled through the dielectric layers before assembly to accommodate copper posts already in place, the dielectric layers may be formed around the copper posts or, as described above, the chip is embedded in the dielectric layers of the package and sandwiched between copper foil layers of the package, before forming openings or vias and plating of copper areas, posts or pillars forming the interconnections.

In some embodiments, more than one chip may be embedded in a single package assembly, for example a GaN power transistor chip may be co-packaged with one or more other GaN power transistors. The GaN power transistor chip may comprise integrated driver circuitry, and/or it may be co-packaged with another chip, e.g. a MOSFET comprising driver circuitry.

The conductive layers, posts, and pillars preferably comprise copper or copper alloy. Alternatively, they may comprise other suitable metals and metal alloys, or composites, which are typically used for semiconductor packaging components, providing they have sufficient current capability and thermal conductivity, and an appropriate coefficient of thermal expansion (CTE).

In embodiments where the back-side of the GaN-on-Si die is directly attached to the thermal pad, sintered silver is preferred as a low inductance, and thermally conductive die-attach material, to provide both an electrical connection and thermal connection of the back-side of the GaN die and the thermal pad. Alternatives to sintered silver comprise, for example, silver impregnated epoxy, lead free solder, or similar die-attach materials.

In embodiments where an intervening layer of interconnect material is required to make electrical connections between metal posts or pillars and overlying or underlying metal layers, interconnect materials are selected that are excellent electrical conductors, capable of withstanding power cycling, and where possible lead-free. Sintered silver provides excellent electrical conductivity and is also excellent thermal conductor. In some embodiments, solder tipped copper pillars may be preferred. For any soldered connections, lead-free solder is preferred.

Fabrication and Performance Considerations

Embedded packaging assemblies for lateral GaN power devices and systems according to embodiments disclosed herein have low inductance, and can carry an increased current relative to conventional wirebonded packages. The package can be fabricated at reasonable cost and with a lower profile (i.e. made thinner) than conventional wirebonded arrangements.

In preferred embodiments, the second level of interconnect comprises thick copper RDL to provide large area, low inductance on-chip source and drain contacts for higher current handling capability. Structures according to embodiments of the invention also provide thermal contact between the back-side of the lateral GaN-on-Si die and a thermal substrate, which reduces thermal impedance (i.e. provides shorter thermal path) and improves device performance.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A semiconductor device structure comprising:
   a GaN power switching device comprising a lateral GaN power transistor fabricated on a semiconductor substrate (GaN die);

the GaN die comprising an on-chip metallization layer defining source, drain and gate contact areas on a front-side of the GaN die, said source and drain contact areas being distributed over an active area of the lateral GaN power transistor and providing a first level of interconnect to a plurality of underlying source and drain electrodes of the lateral GaN power transistor;

an overlying second level of interconnect comprising a dielectric layer formed on the GaN die defining contact openings to the underlying source, drain and gate contact areas of the on-chip metallization layer and a second metallization layer formed thereon defining a source contact area, a drain contact area and one or more gate contact areas, the thickness and lateral dimensions of the source contact area and drain contact area of the second metallization layer being greater than those of the underlying source and drain contact areas of the on-chip metallization layer; and packaging components comprising one or more dielectric layers forming a dielectric body of a package and package metallization;

the GaN chip and overlying second level of interconnect being embedded in the dielectric body of the package with the dielectric body of the package extending laterally around the GaN die;

the package metallization comprising:

an overlying metal layer and an underlying metal layer sandwiching the dielectric body of the package, the overlying metal layer extending over a front-side of the dielectric body and the underlying metal layer extending over a back-side of the dielectric body, the overlying metal layer being patterned to define large area source and drain contact areas extending laterally of the underlying GaN die, and one or more gate contact areas;

the underlying metal layer being patterned to define a thermal pad underlying a back-side of the GaN die, and an external source contact pad, an external drain contact pad, an external gate contact pad, an external source sense pad, each laterally spaced from the thermal pad;

the respective source, drain and gate areas of the second metallization layer on the GaN die being electrically interconnected vertically through the dielectric body of the package with the corresponding source, drain and gate contact areas of the overlying metal layer of the package metallization;

the respective source, drain and gate areas of the overlying metal layer being electrically interconnected vertically through the dielectric body of the package with corresponding external source, drain, and gate contact pads of the underlying metal layer of the package metallization; and the back-side of the GaN die being thermally coupled to the thermal pad.

2. The device of claim 1, wherein the back-side of the GaN die is electrically connected to the thermal pad.

3. The device of claim 1, wherein the source contact area and drain contact area defined by the second metallization layer each comprise a plurality of tapered fingers extending laterally over respective source and drain contact areas of the on-chip metallization layer.

4. The device structure of claim 3, wherein the overlying metal layer of package metallization comprises a corresponding plurality of tapered fingers overlying tapered fingers of the second metallization layer.

5. The device structure of claim 1, wherein the second metallization layer comprises a copper redistribution layer.

6. The device structure of claim 1, wherein metallization of the second level of interconnect comprises a copper redistribution layer and the dielectric comprises a polyimide dielectric.

7. The device structure of claim 1, wherein the underlying and overlying metal layers of the package metallization each comprise a thick plated copper layer or one or more copper foil layers and the dielectric body of the package comprises one or more layers of a prepreg type dielectric.

8. The semiconductor device structure of claim 1, wherein the dimensions metallization layers of first, second and third level interconnects increases from: typically 3 µm -100 µm laterally, and ~5 µm thick, for the on-chip metallization; to 50 µm-500 µm laterally, and ~5-10µm thick, for the second metallization layer; to several mm laterally, ~40 µm or more thick, for the overlying and underlying metallization layers of third level interconnect.

9. The device structure of claim 1, wherein the metallization of the second level interconnect comprises a copper redistribution layer (Cu RDL) and the overlying metallization layer of the package metallization comprises a copper foil layer, and the Cu RDL and overlying thicker copper layer are vertically interconnected through the dielectric body of the package by a plurality of copper pillars.

10. The device structure of claim 1, wherein the source and drain contact areas of the overlying metallization layer and the respective back-side external source pad and external drain pad defined by the underlying metallization layer are vertically interconnected by conductive copper pillars extending through the dielectric of the package around the periphery of the package.

11. The device structure of claim 1, wherein the back-side of the GaN die is thermally connected to the thermal pad by a plurality of copper pillars.

12. The device structure of claim 1, wherein the GaN die comprises a GaN heterolayer structure on a silicon substrate.

13. The device structure of claim 1, wherein the GaN die is co-packaged with a MOSFET driver chip.

14. The device structure of claim 1, comprising a plurality of GaN die embedded within the dielectric body of the package.

15. The device structure of claim 14 wherein the plurality of GaN die are arranged to provide a half-bridge circuit.

* * * * *